United States Patent [19]
Ngan et al.

[11] Patent Number: 5,943,600
[45] Date of Patent: Aug. 24, 1999

[54] TREATMENT OF A TITANIUM NITRIDE LAYER TO IMPROVE RESISTANCE TO ELEVATED TEMPERATURES

[75] Inventors: Kenny King-Tai Ngan, Fremont; Roderick C. Mosely, Pleasanton, both of Calif.

[73] Assignee: Applied Materials, Inc., Santa Clara, Calif.

[21] Appl. No.: 08/840,439

[22] Filed: Mar. 31, 1997

Related U.S. Application Data

[63] Continuation of application No. 08/403,085, Mar. 13, 1995, abandoned.

[51] Int. Cl.$^6$ ........................ H01L 21/324; H01L 21/477
[52] U.S. Cl. ............................ 438/653; 438/663; 438/681
[58] Field of Search ..................................... 438/653, 656, 438/660, 663, 681, 685

[56] References Cited

U.S. PATENT DOCUMENTS

| | | | |
|---|---|---|---|
| 4,784,973 | 11/1988 | Stevens et al. | 437/200 |
| 4,951,601 | 8/1990 | Mayden et al. | 118/719 |
| 5,246,881 | 9/1993 | Sandhu et al. | 437/190 |
| 5,252,518 | 10/1993 | Sandhu et al. | 437/245 |
| 5,275,715 | 1/1994 | Tuttle | 437/245 |
| 5,278,100 | 1/1994 | Doan et al. | 437/245 |
| 5,290,731 | 3/1994 | Sugano et al. | 437/192 |
| 5,312,774 | 5/1994 | Nakamura et al. | 437/190 |
| 5,371,042 | 12/1994 | Ong | 437/203 |
| 5,378,660 | 1/1995 | Ngan et al. | 437/247 |
| 5,552,341 | 9/1996 | Lee | 437/192 |
| 5,612,558 | 3/1997 | Harshfield | 257/298 |
| 5,723,382 | 3/1998 | Sandhu et al. | 438/653 |

FOREIGN PATENT DOCUMENTS

| | | | |
|---|---|---|---|
| 0 209 654 | 1/1987 | European Pat. Off. | H01L 20/40 |
| 0 545 602 A1 | 9/1993 | European Pat. Off. | H01L 21/285 |
| 43 42 047 A1 | 10/1992 | Germany | H01L 23/532 |
| 05-006865 | 5/1993 | Japan. | |

OTHER PUBLICATIONS

Weber et al "Low Temperature Deposition of TiN using Tetrakis(dimethylamido)–titanium in an Electron Cyclotron Resonance Plasma Process", J. Electrochem. Soc., vol. 141, No. 3, Mar. 1994, pp. 849–853.

EP Search Report for Application 96103468.3, Aug. 1997.

Sun et al, "Effect of rapid thermal annealing on the electrical and physical properties of metalorganic chemical–vapor–deposited TiN", Appl. Phys. Lett., vol. 68, No. 5, pp. 670–672, Jan. 1996.

Raaijmakers et al, "Low temperature MOCVD of advanced barrier layers for the microelectronics industry", Applied Surface Science, vol. 73, pp. 31–41, 1993.

S. Wolf, "Silicon Processing for the VLSI Era, vol. 2", Lattice Press, 1990, pp. 255–256.

*Primary Examiner*—John F. Niebling
*Assistant Examiner*—Ha Tran Nguyen
*Attorney, Agent, or Firm*—Birgit E. Morris

[57] ABSTRACT

A method of stabilizing chemical vapor deposited titanium nitride layers so that they can withstand a subsequent high temperature deposition of aluminum which comprises heating said film in nitrogen containing from about 3–15% by volume of oxygen. When aluminum is deposited over the treated titanium nitride film, the barrier properties of the titanium nitride are maintained up to temperatures of at least about 575° C.

10 Claims, 4 Drawing Sheets

TREATMENT OF A TITANIUM NITRIDE LAYER TO IMPROVE RESISTANCE TO ELEVATED TEMPERATURES

This application is a continuation of application Ser. No. 08/403,085 filed Mar. 13, 1995, now abandoned.

This invention relates to a method for the post deposition treatment of titanium nitride thin films used as barrier layers between aluminum layers and a silicon substrate. More particularly, this invention relates to a post deposition treatment of chemical vapor deposited titanium nitride layers that enables them to withstand temperatures higher than about 400° C.

BACKGROUND OF THE INVENTION

Titanium nitride layers have found utility in the manufacture of semiconductor devices, particularly as barrier layers between a semiconductor substrate, e.g., a silicon wafer, and overlying conductive layers from which contacts are made. For example, a layer of titanium may be sputter deposited and annealed in nitrogen to form a titanium nitride layer that prevents an after deposited aluminum layer from spiking through the layer and directly contacting the underlying silicon substrate, causing a short. Titanium nitride has a low bulk resistivity and makes good ohmic contact to conductive layers such as aluminum. It also has good adhesion properties.

The preferred method of forming titanium nitride barrier layers up till recently has been to sputter titanium metal in a nitrogen environment, thereby depositing titanium nitride onto a silicon wafer surface, or into contact openings in the silicon surface. This method of deposition can be used at high temperatures, when the titanium metal reacts with the underlying silicon surface to form an ohmic contact of titanium silicide on the silicon, followed by formation of the titanium nitride barrier layer. Thus the titanium silicide and titanium nitride barrier layers can be formed in a single step. The resistivity of these films is very low, about 36 $\mu$ohms-cm.

However, as devices become ever smaller and more devices are made on a single silicon wafer, requiring a higher density of devices, it is more difficult to sputter deposit uniformly thick layers of titanium nitride over the bottom and sidewalls of an opening, particularly as the aspect ratio of the opening (ratio of depth to width) becomes higher; and to cover very narrow lines without leaving voids at the base corners. The bottom step coverage for 0.6 micron wide lines, or deposition into a 1.75:1 aspect ratio opening, is only about 46%.

Thus more recently a chemical vapor deposition method has been employed which deposits more conformal layers of titanium nitride. Sandhu et al, see U.S. Pat. No. 5,246,881, have disclosed the deposition of titanium nitride from a metallo-organo titanium compound having the formula Ti(NR$_2$)$_4$ wherein R is an alkyl group. These metallo-organo titanium compounds can be decomposed with activated species of halogen, hydrogen or ammonia for example, at relatively low temperatures of 200–600° C. at a vacuum pressure of about 0.1–100 Torr, to deposit highly conformal titanium nitride layers. This method deposits titanium nitride at good deposition rates, with excellent conformality and step coverage (the step coverage is about 90% over a 0.6 micron wide line or into an opening having an aspect ratio of 1.75:1).

However, when aluminum is deposited over high aspect ratio openings in silicon, high aluminum deposition temperatures, e.g., at or above the flow temperature of aluminum, must be used so that the aluminum will uniformly fill the openings and form a planarized layer. However, when high aluminum deposition temperatures are used, the titanium nitride barrier layers are inadequate to prevent aluminum spiking through the titanium nitride layer.

Thus a method was sought to improve the barrier properties of titanium nitride layers to prevent aluminum spiking when the substrate is heated to temperatures above about 400–450° C., near the flow temperature of aluminum.

It is also known that the addition of oxygen to titanium nitride barrier layers improves their barrier properties. Such a process is known for sputter deposition processes, when, after a high temperature anneal to form a titanium silicide contact layer, a low temperature anneal is carried out in the presence of a small amount of oxygen. This two-step anneal must be carried out sequentially at high vacuum, without removing the substrate from a vacuum environment. The high vacuum required for sputter deposition is from about $10^{-6}$ to $10^{-9}$ millitorr.

However, the chemical vapor deposition process is carried out at much higher pressures of about 0.1 to 100 Torr. Oxygen cannot be added to the deposition chamber, because the chamber contains large amounts of carbon-containing radicals, which would react to form silicon oxide. Contamination of the titanium nitride films would result, increasing the bulk resistivity of the films to unacceptably high levels. Further, these titanium nitride films are unstable and their resistivity increases over time. Sandhu et al added a Lewis base to the metallo-organo titanium precursor compound to reduce the resistivity of the film, such as a Lewis base of chlorine, ammonia or nitrogen trifluoride, but these Lewis bases introduce other contaminants into the titanium nitride films.

Thus a method of post treating titanium nitride films deposited by chemical vapor deposition of organo-metallo titanium compounds, that will stabilize the films to elevated temperatures has been sought.

SUMMARY OF THE INVENTION

The present process is a single step anneal in a small amount of oxygen in a high temperature nitrogen ambient of a chemical vapor deposited titanium nitride barrier layer. The post deposition treatment step produces a strong barrier layer that will withstand subsequent high temperature processing, such as of an overlying aluminum layer, at temperatures at or above the flow temperature of aluminum, without interdiffusion or spiking of the aluminum layer through the titanium nitride barrier layer.

DETAILED DESCRIPTION OF THE INVENTION

Figure 1:
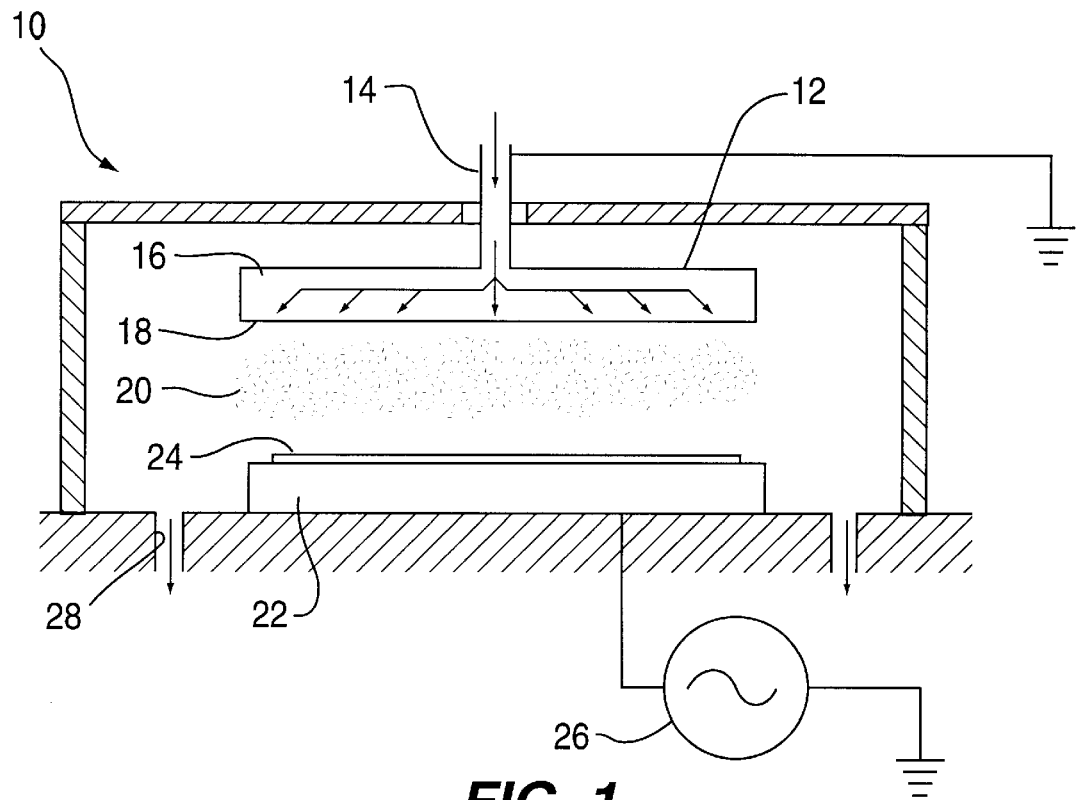
FIG. 1 is a schematic diagram of a chemical vapor deposition chamber in which titanium nitride films can be deposited according to the present invention.

In accordance with the present process, a titanium nitride barrier layer is deposited in a chemical vapor deposition apparatus as shown in FIG. 1.

Referring to FIG. 1, a vacuum chamber 10 includes two electrodes; a first gas inlet electrode 12 comprising a precursor gas inlet pipe 14 for entry of one or more precursor and treatment gases into the vacuum chamber 10. The gas inlet pipe 14 is connected to a second chamber 16 wherein the precursor gases are mixed if required, and from which they pass through a plate 18 having a plurality of openings. The precursor gases then pass into a space 20. The gas inlet electrode 12 is connected to ground.

A second substrate support electrode 22, for mounting and heating a substrate 24 to be coated, is mounted opposite to and parallel to the gas manifold plate 18. The support electrode 22 is connected to a source of RF power 26, e.g., a 13.56 MHz power source. When the power source 26 is turned on, a plasma is generated in the space 20 between the electrodes 12 and 22. The spacing between the electrodes 12 and 22 can be adjusted. An exhaust pipe 28 is connected to a pump (not shown) that regulates the pressure in the chamber 10 and evacuates spent and by-product gases.

The present titanium nitride films are deposited from an organo-metallo titanium compound as described above. The preferred compound for use herein is tetrakisdialkylamido titanium having the structural formula

Figure 2A:
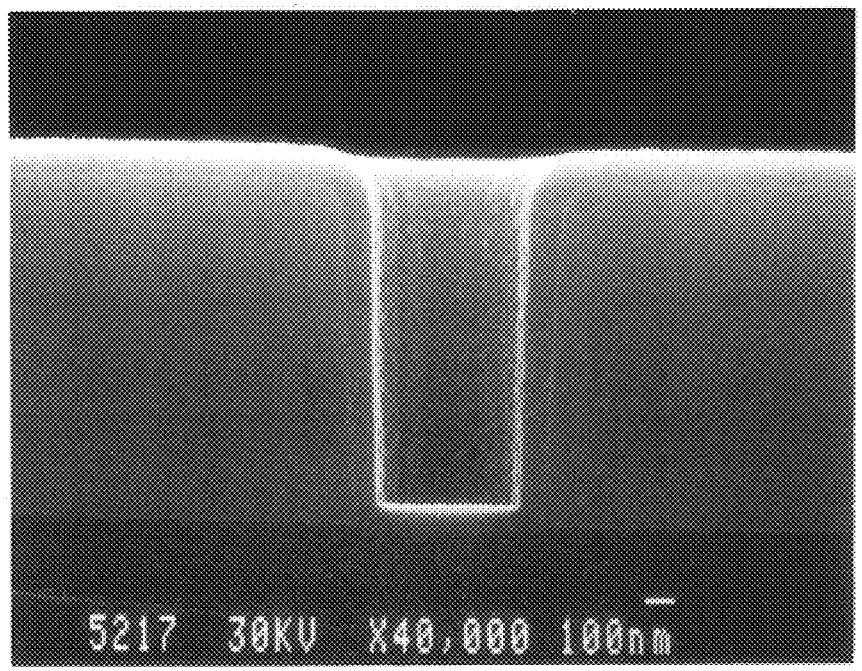
FIG. 2A is a photomicrograph showing an opening filled with the CVD titanium nitride.
Figure 2B:
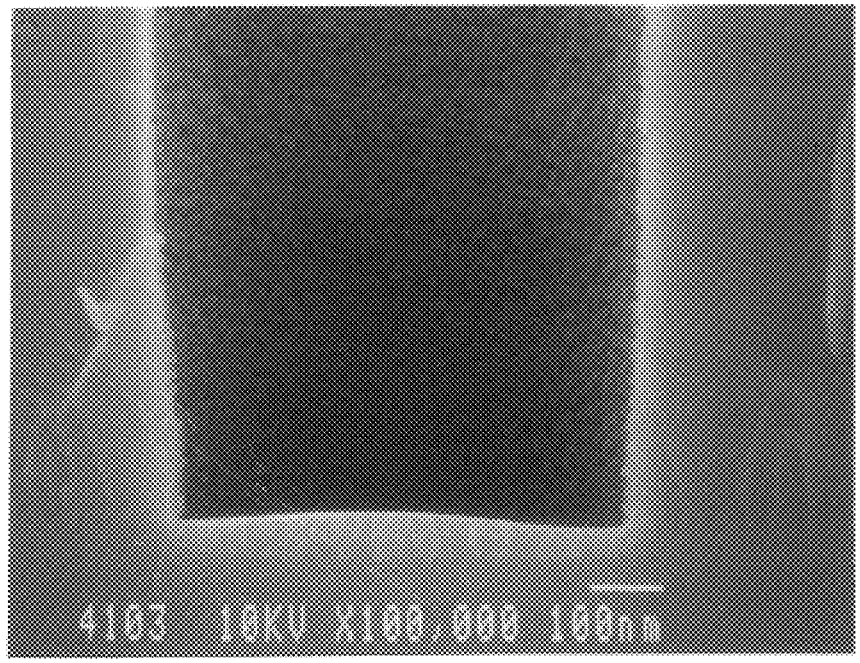
FIG. 2B is a photomicrograph showing an opening filled with sputtered titanium nitride.

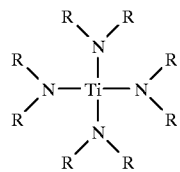

wherein R at each occurrence independently is an alkyl group, preferably of 1–5 carbon atoms. A carrier gas, as of helium argon, nitrogen, hydrogen and the like, for the above compound carries the compound into the chamber of FIG. 1 where it is reacted with remotely generated active species, such as of halogen, ammonia or hydrogen radicals, at a substrate temperature of 200–600° C. and a pressure of about 0.1–100 Torr. Titanium nitride is deposited over the substrate in the chamber. The almost perfect conformality of these films is shown in the photomicrographs of FIG. 2A, in contrast with a titanium nitride film deposited by physical vapor deposition (sputtering) of FIG. 2B for an opening having a 1.75:1 aspect ratio.

It is known that the resultant titanium nitride deposit contains significant amounts of carbon and is chemically reactive. Thus when these titanium nitride films are later exposed to air or other oxygen-containing gas, oxygen is absorbed by the titanium nitride, and, since oxygen absorption is thus uncontrolled, the stability of the titanium nitride film is impaired, which adversely affects the resistivity of the films. After exposure to air, the resistivity of these films rises to about 10,000 µohm-cm, whereas stable resistivities on the order of 1000 µohm-cm is desirable.

In accordance with the post treatment step of the present invention, the chemical vapor deposited titanium nitride films are transferred to a chamber in which the films can be exposed to a controlled amount of oxygen at elevated temperatures. The oxygen is absorbed by the titanium nitride barrier layer, stabilizing the film to later exposure to high temperatures of above 400° C. or more, particularly to temperatures from about 450–575° C. during subsequent deposition of aluminum over the titanium nitride layer.

Figure 3:
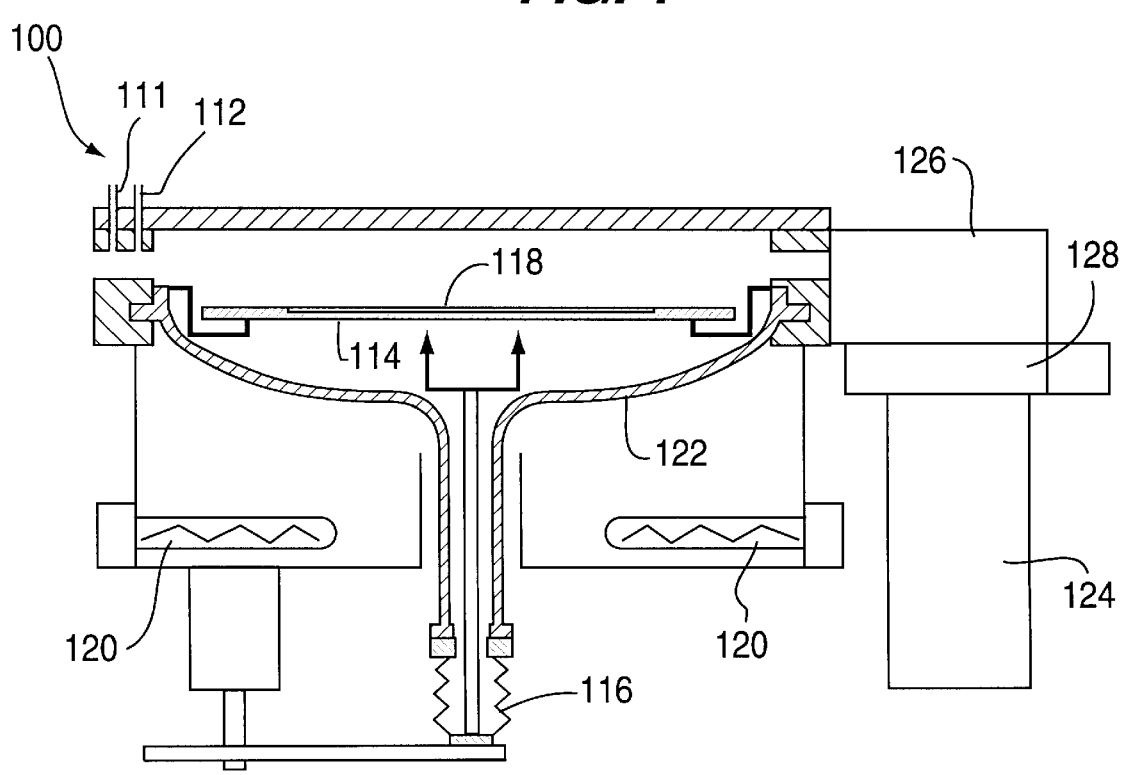
FIG. 3 is a schematic diagram of a metal annealing chamber in which titanium nitride films are post treated in accordance with the present invention.

This single post treatment step can be carried out in a metal annealing chamber as shown in FIG. 3.

The metal annealing chamber 100 includes ports 111 and 112 for incoming gases. A susceptor 114 is coordinated with an elevator mechanism 116. This enables a substrate 118 supported by the susceptor 114 to interface with a substrate transfer chamber (not shown) for additional processing.

The susceptor 114 is heated by means of a plurality of external heating lamps 120 directed through a light transmissive, quartz window 122 in the bottom of the chamber 100. The pressure in the chamber 100 is controlled by a pump 124 via an exhaust channel 126. A valve 128 regulates the pressure of the chamber 100. The temperature and pressure are regulated in conventional manner.

The temperature of the titanium nitride coated substrate is regulated to between about 450–800° C. during the post treatment step, and the pressure is maintained at at least about 1 torr. The pressure is not critical and although vacuum processing is preferred, as further described below, pressures up to atmospheric pressure can be employed. A flow of inert gas, such as nitrogen containing from about 3–15% by volume of oxygen, is passed into the chamber. This post treatment step can be completed in about 20–30 seconds.

The resultant titanium nitride barrier layers have stable sheet resistance and they can withstand elevated temperatures. For example, an aluminum layer deposited at high temperature, above the flow temperature of aluminum, will withstand spiking or interdiffusion of the titanium nitride and aluminum layers.

Figure 4:
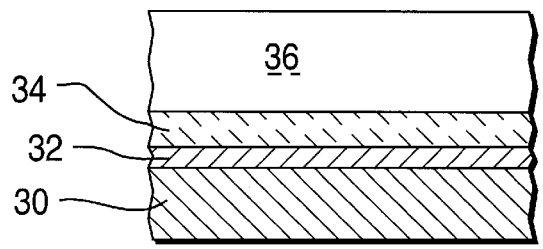
FIG. 4 is a cross sectional view of a film stack employing a chemical vapor deposited titanium nitride layer and an overlying aluminum contact layer.

A comparison of a prior art metal-titanium nitride-silicon stack, shown in FIG. 4 and that of the present post treated metal-titanium nitride-silicon stack, is given below. The metal-titanium nitride-silicon stack as shown in FIG. 4 comprises a silicon substrate 30, a thin layer of titanium 32 about 150 angstroms thick, a 200 angstrom thick layer of titanium nitride film 34 deposited as described above by CVD, and a layer 36 about 2400 angstroms thick of an aluminum alloy containing about 0.5% by weight of copper is sputter deposited from a composite aluminum/0.5% copper target. The substrate was exposed to air after deposition of the titanium layer and after deposition of the CVD titanium nitride layer.

The above stack was heated at 450° C. in nitrogen for one hour, its resistance measured, and the temperature increased up to 575° C. incrementally. The sheet resistance of the film was measured at every 25° C. incremental increase in temperature.

The same procedure was repeated except using the post treatment CVD titanium nitride film of the present invention.

Figure 5:
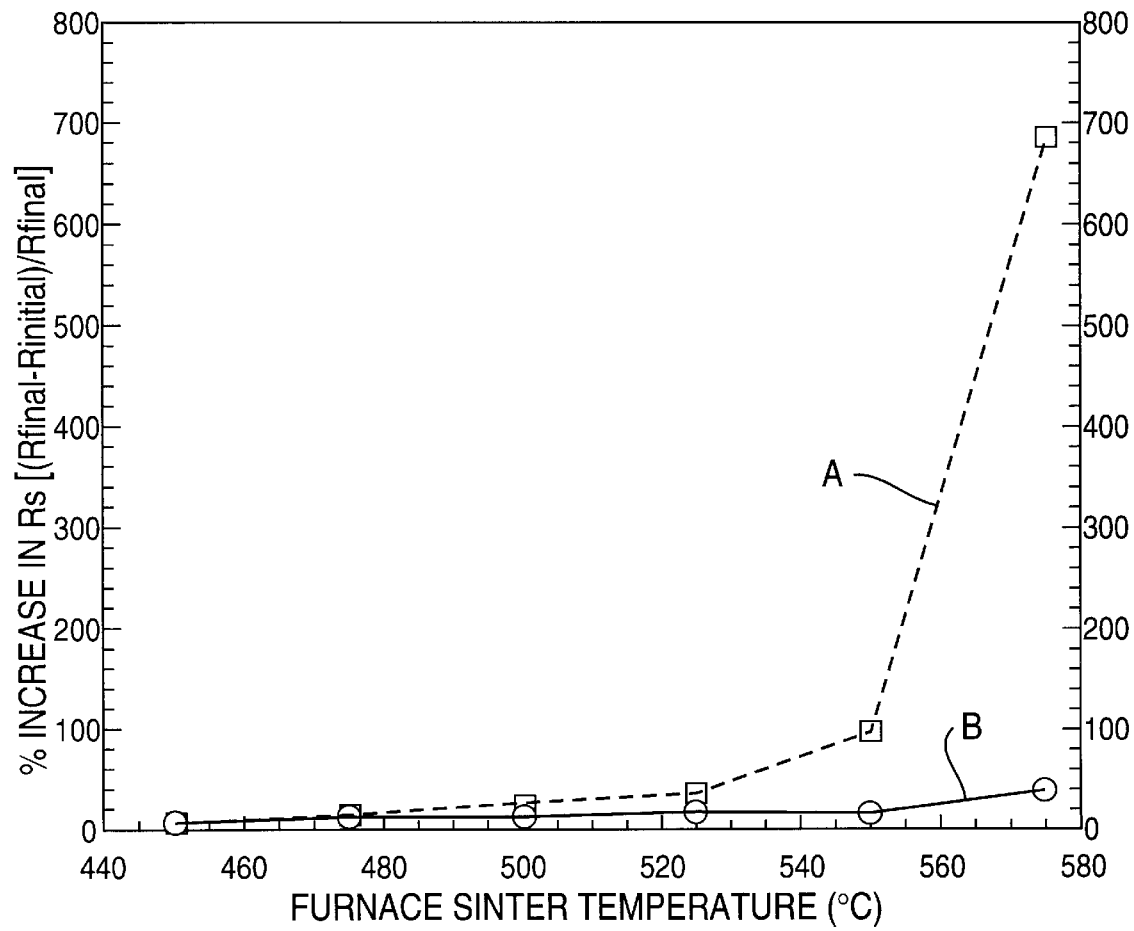
FIG. 5 is a graph of sheet resistance versus sintering temperature for a prior art titanium nitride film and a titanium nitride film treated in accordance with the present invention.

The results are given in FIG. 5, which is a graph of % increase in stress resistance ($R_s$) versus sintering temperature.

It is apparent that the prior art film stack (line A) started to fail at a temperature of about 525° C. and completely failed at about 570° C.; whereas the post treated film of the present invention (line B) showed very little increase in $R_S$ to a temperature of about 575° C. This shows the barrier layer of the invention is still intact at 575° C.

The metal layers of the stack of the present invention and of the prior art stack were then removed using a wet etch, which can include mixtures such as sulphuric acid/hydrogen peroxide and ammonium hydroxide/hydrogen peroxide, and dilute hydrofluoric acid.

Figure 6A:
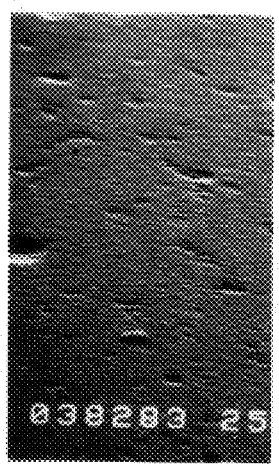
FIG. 6A is a photomicrograph of a silicon surface after exposure of an aluminum-titanium nitride-silicon stack of the prior art to a temperature of 575° C.

FIG. 6A is a photomicrograph of the air-exposed prior art stack after heating to 575° C. and removing the metal layers. It is apparent that the silicon surface is pitted, indicating that severe aluminum spiking had occurred.

Figure 6B:
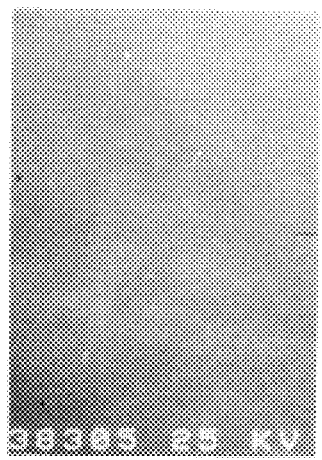
FIG. 6B is a photomicrograph of a silicon surface after exposure of an aluminum-titanium nitride-silicon stack of the present invention to a temperature of 575° C.

FIG. 6B is a photomicrograph of the silicon surface after post treatment of a CVD titanium nitride barrier layer stack had been exposed to temperatures of 575° C. and then the metals stripped away by wet etching as above.

It is apparent that the surface of the silicon is completely smooth, indicating that no spiking of aluminum or pitting of the silicon surface had taken place, and that the titanium nitride barrier layer could withstand temperatures to 575° C.

Figure 7:
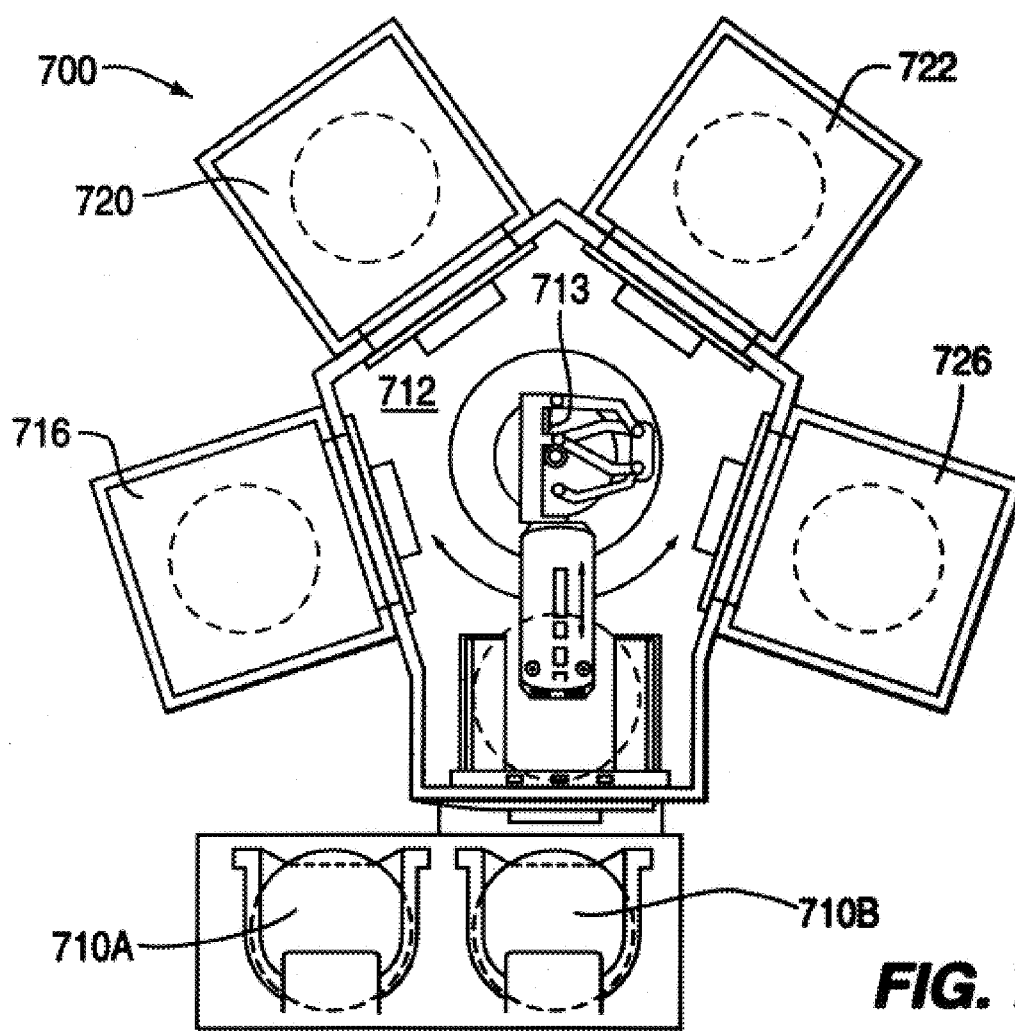
FIG. 7 is a plan view of a multichamber vacuum processing system in which the present process can be carried out.

In a preferred method of the invention, all of the deposition and treatment steps of the present process are carried out in a multi-chamber vacuum system, as has been disclosed by Maydan et al, U.S. Pat. No. 4,951,601. This system comprises a plurality of processing vacuum chambers connected to a high vacuum substrate transfer chamber. Each of the processing chambers processes a single wafer at a time, but multiple wafers are accommodated in the system by parallel processing in the various chambers. A suitable multichamber system for carrying out the present process is shown in FIG. 7. The system 700 of FIG. 7 includes two independently operated loadlock chambers 710A and 710B for loading and unloading substrates into the system. The substrates are transferred into a substrate transfer chamber 712 fitted with a planar, two axis magnetically coupled robot 713 for transfer of substrates to various of the connected processing chambers. For example, a preclean chamber 716 can be used to sputter clean or plasma clean the substrate to remove the native oxide layer from air exposed silicon substrates. The substrate can then be transferred to various processing chambers. For example, to make the stack of FIG. 4, the titanium layer is deposited in a sputtering chamber 720, the CVD deposition of titanium nitride is carried out in a CVD chamber 722 such as that shown in FIG. 1, then transferred to the MAC chamber 726 of FIG. 3 for controlled oxidation of the titanium nitride layer. Aluminum or aluminum alloy is sputter deposited in a high temperature physical vapor deposition chamber (not shown).

The substrate is then transferred to the load lock chamber 710B for transfer out of the system 700.

Additional processing chambers, for additional etch or deposition steps, can also be added to the system 700.

Although the present invention has been described in terms of particular equipment and processing conditions, it will be apparent to one skilled in the art that other equipment and processing conditions can be substituted and are meant to be included herein. The invention is only to be limited by the scope of the appended claims.

We claim:

1. A method of forming a chemical vapor deposited titanium nitride layer that has a stable sheet resistance to a temperature over about 400° C. which comprises depositing a titanium nitride film from an organo-metallo titanium compound, and annealing said film in nitrogen containing a controlled amount of oxygen.

2. A method according to claim 1 wherein said annealing is done in a metal annealing chamber.

3. A method according to claim 2 wherein said annealing step is carried out at temperatures from about 450–800° C.

4. A method according to claim 1 wherein the pressure during annealing is at least one torr.

5. A method according to claim 1 wherein after said annealing step a layer of aluminum or aluminum alloy is deposited over the annealed titanium nitride layer.

6. A method according to claim 1 wherein said chemical vapor deposited titanium nitride layer is deposited over a silicon substrate.

7. A method according to claim 5 wherein said chemical vapor deposited titanium nitride layer is deposited over a silicon substrate.

8. A method according to claim 7 wherein said silicon substrate-annealed chemical vapor deposited titanium nitride-aluminum stack is heated above the flow temperature of aluminum.

9. A method of forming a chemical vapor deposited titanium nitride layer that has a stable sheet resistance to a temperature above about 550° C. which comprises depositing a titanium nitride film on a silicon substrate from an organo-metallo titanium compound, annealing said film in nitrogen containing a controlled amount of oxygen at a temperature between 450–800° C., and depositing a layer of aluminum or aluminum alloy over the annealed titanium nitride layer.

10. A method according to claim 9 wherein the annealed titanium nitride and aluminum deposited layers are heated to a temperature above about 575° C.

* * * * *